US010157930B2

United States Patent
Chen et al.

(10) Patent No.: US 10,157,930 B2
(45) Date of Patent: Dec. 18, 2018

(54) METHOD FOR FABRICATING MEMORY DEVICE

(71) Applicant: Winbond Electronics Corp., Taichung (TW)

(72) Inventors: Chun-Hsu Chen, Taichung (TW); Hsu-Chi Cho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 23 days.

(21) Appl. No.: 15/353,717

(22) Filed: Nov. 16, 2016

(65) Prior Publication Data

US 2018/0061848 A1 Mar. 1, 2018

(30) Foreign Application Priority Data

Aug. 30, 2016 (CN) .......................... 2016 1 0764693

(51) Int. Cl.
| | |
|---|---|
| *H01L 27/115* | (2017.01) |
| *H01L 29/788* | (2006.01) |
| *H01L 21/28* | (2006.01) |
| *H01L 27/11546* | (2017.01) |
| *H01L 27/11524* | (2017.01) |
| *H01L 27/11529* | (2017.01) |

(52) U.S. Cl.
CPC .. *H01L 27/11546* (2013.01); *H01L 21/28273* (2013.01); *H01L 27/11524* (2013.01); *H01L 27/11529* (2013.01); *H01L 29/7883* (2013.01)

(58) Field of Classification Search
CPC ......... H01L 21/28273; H01L 27/11524; H01L 27/11529; H01L 27/11546; H01L 29/7883
See application file for complete search history.

(56) References Cited

FOREIGN PATENT DOCUMENTS

TW 201537691 10/2015

OTHER PUBLICATIONS

Machine Translation of TW 201537691.*
"Office Action of Taiwan Counterpart Application," dated May 12, 2017, p. 1-p. 6.

* cited by examiner

*Primary Examiner* — Mary Wilczewski
(74) *Attorney, Agent, or Firm* — JCIPRNET

(57) ABSTRACT

A method for fabricating a memory device is provided. In the method, a first gate dielectric layer is formed on a substrate in a first region. A second gate dielectric layer is formed on the substrate in a second region and a third region. A first conductive layer is formed on the substrate. A first dielectric layer is directly formed on the first conductive layer. One portion of the first dielectric layer, one portion of the first conductive layer, and one portion of the second gate dielectric layer in the second region are removed. A third gate dielectric layer and a second conductive layer are formed sequentially on the substrate in the second region. A third conductive layer and a second dielectric layer are formed sequentially on the substrate. Isolation structures are formed in the substrate. Here, the isolation structures penetrate the second dielectric layer and extend into the substrate.

10 Claims, 13 Drawing Sheets

METHOD FOR FABRICATING MEMORY DEVICE

CROSS-REFERENCE TO RELATED APPLICATION

This application claims the priority benefit of China application serial no. 201610764693.0, filed on Aug. 30, 2016. The entirety of the above-mentioned patent application is hereby incorporated by reference herein and made a part of this specification.

FIELD OF THE INVENTION

The invention relates to a method for fabricating a semiconductor device; more particularly, the invention relates to a fabricating method of a memory device.

DESCRIPTION OF RELATED ART

With the advancement of science and technology, it has become a trend to integrate components in a cell region and a periphery region on the same chip to reduce costs and simplify manufacturing steps of a semiconductor device. A triple gate oxide manufacturing method is one of the methods for integrating the components in the cell region and the periphery region on the same chip.

In the conventional triple gate oxide manufacturing method, however, a buffer oxide layer easily remains between floating gates, which leads to an increase in the resistance of the floating gates. Subsequently, the resistance of the contacts on the floating gates may also be increased, and the performance, the reliability, and the yield of the resultant products may be deteriorated.

SUMMARY OF THE INVENTION

The invention is directed to a method for fabricating a memory device without forming any buffer oxide layer, so as to reduce the resistance of floating gates and contacts and further enhance the performance, the reliability, and the yield of the resultant products.

Since the method for fabricating the memory device as provided herein does not include the step of forming the buffer oxide layer; the manufacturing process can be simplified, and the production costs can be reduced.

In an embodiment of the invention, a method for fabricating a memory device includes following steps. A substrate that is divided into a first region, a second region, and a third region is provided. A first gate dielectric layer is formed on the substrate in the first region. A second gate dielectric layer is formed on the substrate in a second region and a third region. A first conductive layer is formed on the substrate. A first dielectric layer is directly formed on the first conductive layer. One portion of the first dielectric layer, one portion of the first conductive layer, and one portion of the second gate dielectric layer in the second region are removed, so as to partially expose a surface of the substrate in the second region. A third gate dielectric layer and a second conductive layer are formed sequentially on the substrate in the second region. A third conductive layer and a second dielectric layer are formed sequentially on the substrate. Isolation structures are formed in the substrate. Here, the isolation structures penetrate the second dielectric layer and extend into the substrate.

As discussed above, in the method for fabricating the memory device as provided herein, the triple gate oxide manufacturing process is performed to integrate the components in the cell region and the periphery region on the same chip. The triple gate oxide manufacturing process does not include the step of forming the buffer oxide layer, so as to avoid the issue of the remaining buffer oxide layer between the floating gates. Through applying the method for fabricating the memory device as provided herein, the resistance of the floating gates and the contacts can be reduced, and the performance, the reliability, and the yield of the resultant products can be improved. Besides, compared to the conventional method, the method for manufacturing the memory device provided herein does not include the step of forming the buffer oxide layer; hence, the manufacturing process can be simplified, and the production costs can be reduced.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF EMBODIMENTS

In the following embodiments, if a first conductive type is N-type, a second conductive type is P-type; if the first conductive type is P-type, the second conductive type is N-type. In the present embodiment, the first conductive type is N-type and the second conductive type is P-type, for instance. A P-type dopant is boron, an N-type dopant is phosphorus or arsenic, for example.

Figure 1A:
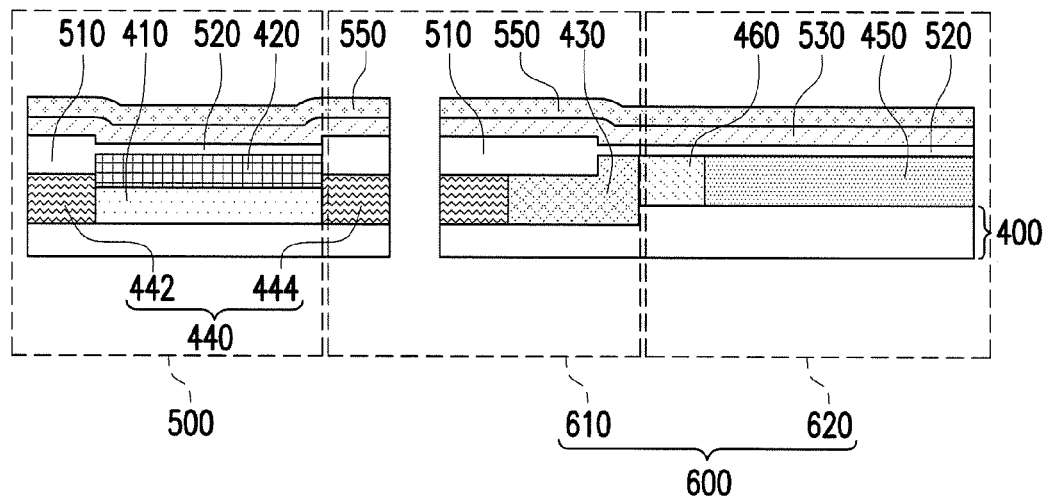
FIG. 1A to FIG. 1K are schematic cross-sectional views illustrating a method for fabricating a memory device according to a first embodiment of the invention.
Figure 3:
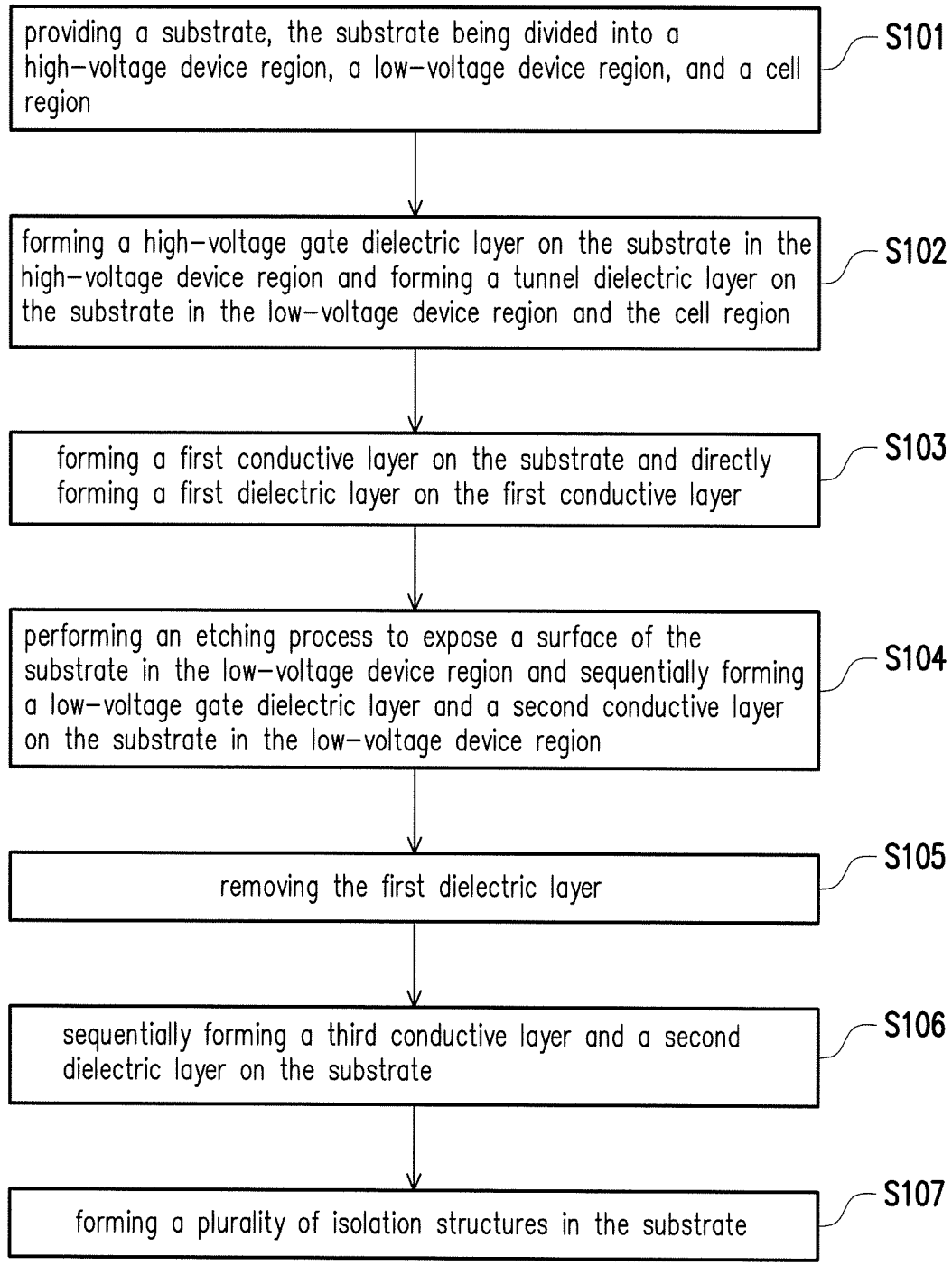
FIG. 3 is a flowchart illustrating the method for fabricating the memory device according to the first embodiment of the invention.

With reference to FIG. 1A and FIG. 3, a step S101 is performed to provide a substrate 400. The substrate 400 may include at least one material selected from a group consisting of Si, Ge, SiGe, GaP, GaAs, SiC, SiGeC, InAs, and InP, for instance. In an embodiment of the invention, the substrate 400 also be an SOI substrate. The substrate 400 has a cell region 500 (e.g., a third region) and a periphery region 600. To be specific, the periphery region 600 includes a high-voltage device region 610 (e.g., a first region) and a low-voltage device region 620 (e.g., a second region).

According to an embodiment of the invention, the substrate 400 in the cell region 500 may include a deep well 410 of the first conductive type, a first well 420 of the second conductive type, and a second high-voltage well 440 of the first conductive type. The substrate 400 in the high-voltage device region 610 may include a first high-voltage well 430 of the second conductive type. The substrate 400 in the low-voltage device region 620 may include a first low-voltage well 450 of the first conductive type and a second low-voltage well 460 of the second conductive type. In other embodiments, the substrate 400 in the cell region 500, the high-voltage device region 610, and the low-voltage device region 620 may include different types of wells and a combination thereof, for instance.

Particularly, the deep well 410 may be located in the substrate 400 in the cell region 500. The deep well 410 may be formed by forming a patterned mask layer and performing an ion implantation process. In an embodiment, the dopant implanted in the deep well 410 is phosphorus or arsenic, a dopant dose is $1\times10^{10}/cm^2$ to $1\times10^{14}/cm^2$, and implanted energy is 1000 keV to 4000 keV, for instance.

The first well 420 may be located on the deep well 410 and may be formed by forming a patterned mask layer and performing an ion implantation process. In an embodiment, the dopant implanted in the first well 420 is boron, a dopant dose is $1\times10^{10}/cm^2$ to $1\times10^{14}/cm^2$, and implanted energy is 10 keV to 1000 keV, for instance.

The second high-voltage well 440 may include two second high-voltage wells 442 and 444 of the second conductive type. The two second high-voltage wells 442 and 444 are respectively located at two sides of the deep well 410 and the first well 420. That is, the deep well 410 and the first well 420 are located between the two second high-voltage wells 442 and 444. The second high-voltage wells 442 and 444 may be formed by forming a patterned mask layer and performing an ion implantation process. In an embodiment, the dopant implanted in the second high-voltage wells 442 and 444 is phosphorus or arsenic, a dopant dose is $1\times10^{10}/cm^2$ to $1\times10^{14}/cm^2$, and implanted energy is 10 keV to 2000 keV, for instance.

The first high-voltage well 430 is located in the substrate 400 in the high-voltage device region 610. The first high-voltage well 430 may be formed by forming a patterned mask layer and performing an ion implantation process. In an embodiment, the dopant implanted in the first high-voltage well 430 is boron, a dopant dose is $1\times10^{10}/cm^2$ to $1\times10^{14}/cm^2$, and implanted energy is 10 keV to 1000 keV, for instance.

The first low-voltage well 450 is located in the substrate 400 in the low-voltage device region 620. The first low-voltage well 450 may be formed by forming a patterned mask layer and performing an ion implantation process. In an embodiment, the dopant implanted in the first low-voltage well 450 is phosphorus or arsenic, a dopant dose is $1\times10^{10}/cm^2$ to $1\times10^{14}/cm^2$, and implanted energy is 1 keV to 1000 keV, for instance.

The second low-voltage well 460 is located in the substrate 400 between the first high-voltage well 430 and the first low-voltage well 450. The second low-voltage well 460 may be formed by forming a patterned mask layer and performing an ion implantation process. In an embodiment, the dopant implanted in the second low-voltage well 460 is boron, a dopant dose is $1\times10^{10}/cm^2$ to $1\times10^{14}/cm^2$, and implanted energy is 1 keV to 1000 keV, for instance.

As shown in FIG. 1A and FIG. 3, a step S102 is performed to form a high-voltage gate dielectric layer 510 (e.g., a first gate dielectric layer) on the substrate 400 in the high-voltage device region 610. The high-voltage gate dielectric layer 510 may be a silicon oxide layer, a silicon oxynitride layer, or a silicon nitride layer, for instance, and a method for forming the high-voltage gate dielectric layer 510 may include performing a local oxidation of silicon method. In an embodiment of the invention, a thickness of the high-voltage gate dielectric layer 510 is between 30 nm to 70 nm.

In the step S102, a tunnel dielectric layer 520 (e.g., a second gate dielectric layer) is formed on the substrate 400 in the cell region 500 and the low-voltage device region 620. The tunnel dielectric layer 520 may be a silicon oxide layer, a silicon oxynitride layer, or a silicon nitride layer, for instance, and a method for forming the tunnel dielectric layer 510 may include a chemical vapor deposition method, an in-situ vapor growth method, a low-pressure free radical oxidation method, or a furnace oxidation method. In an embodiment of the invention, a thickness of the tunnel dielectric layer 520 is between 5 nm to 9 nm.

A step S103 is then performed to form a first conductive layer 530 on the substrate 400. The first conductive layer 530 may be doped polysilicon, undoped polysilicon, or a combination thereof, for instance, and a method for forming the first conductive layer 530 may be a chemical vapor deposition method, a low-pressure chemical vapor deposition method, or a furnace oxidation method. In an embodiment of the invention, a thickness of the first conductive layer 530 is between 10 nm to 40 nm.

In the step S103, a first dielectric layer 550 is directly formed on the first conductive layer 530. Particularly, the first dielectric layer 550 and the first conductive layer 530 are in direct contact with each other, and no oxide layer is located between the first dielectric layer 550 and the first conductive layer 530. According to an embodiment of the invention, the first dielectric layer 550 may be a silicon nitride layer, and a method for forming the first dielectric layer 550 may be a chemical vapor deposition method. In an embodiment of the invention, a thickness of the first dielectric layer 550 is between 10 nm to 40 nm. Due to the small thickness of the first dielectric layer 550, the stress impact resulting from the first dielectric layer 550 may be ignored.

Figure 1B:
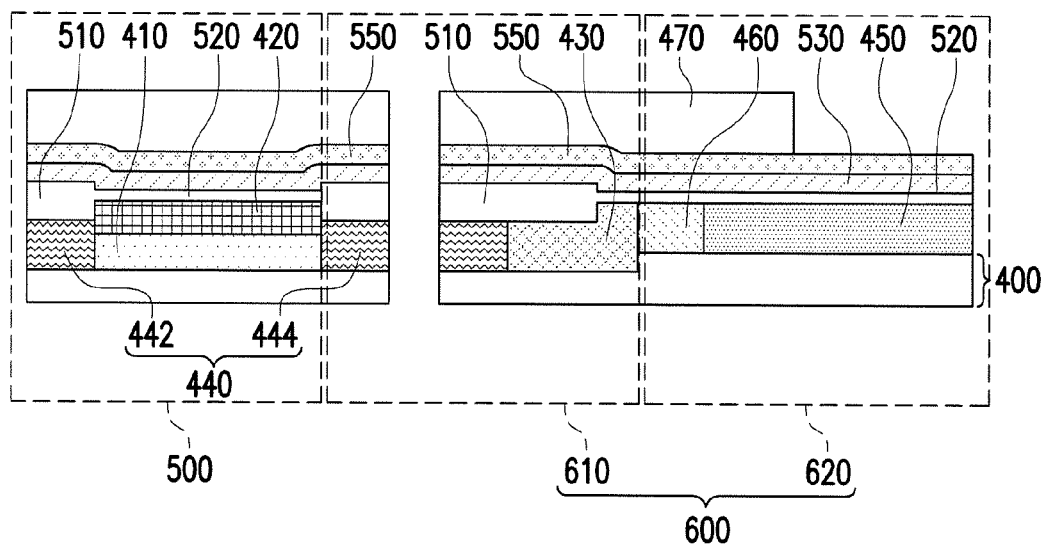

With reference to FIG. 1B, a patterned mask layer 470 is formed on the substrate 400. The patterned mask layer 470 may include carbon or a photoresist material. The patterned mask layer 470 partially exposes a surface of the first dielectric layer 550 in the low-voltage device region 620.

Figure 1C:
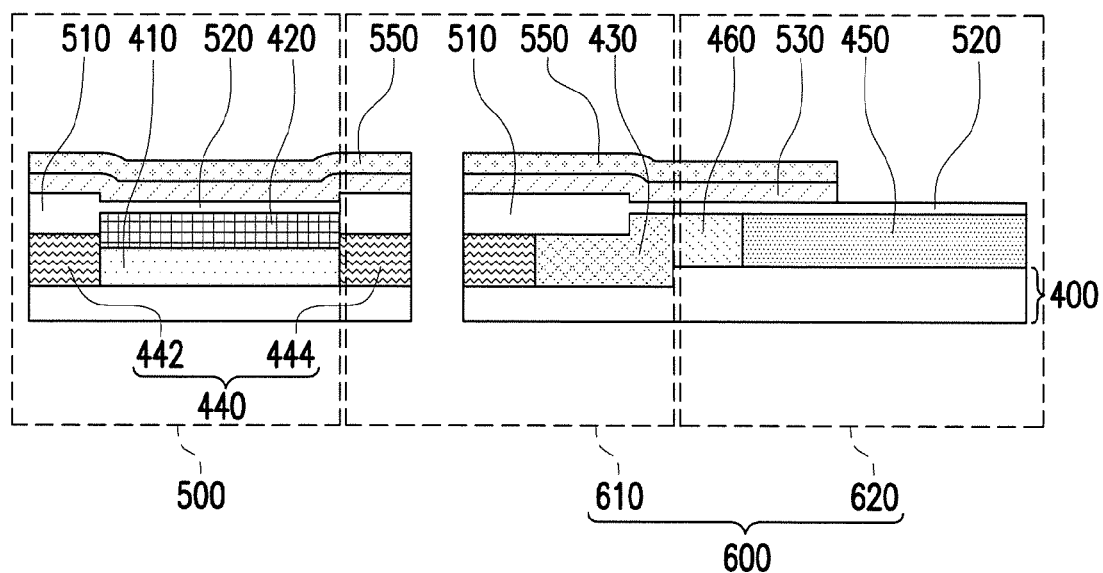

With reference to FIG. 1C and FIG. 3, in a step S104, an etching process is performed to sequentially remove one portion of the first dielectric layer 550 and one portion of the first conductive layer 530 in the low-voltage device region 620, so as to expose a surface of the tunnel dielectric layer 520. The patterned mask layer 470 is then removed. In an embodiment of the invention, a method of removing the patterned mask layer 470 may include ashing the patterned mask layer 470 with use of high-density plasma and then performing a wet cleansing process.

Figure 1D:
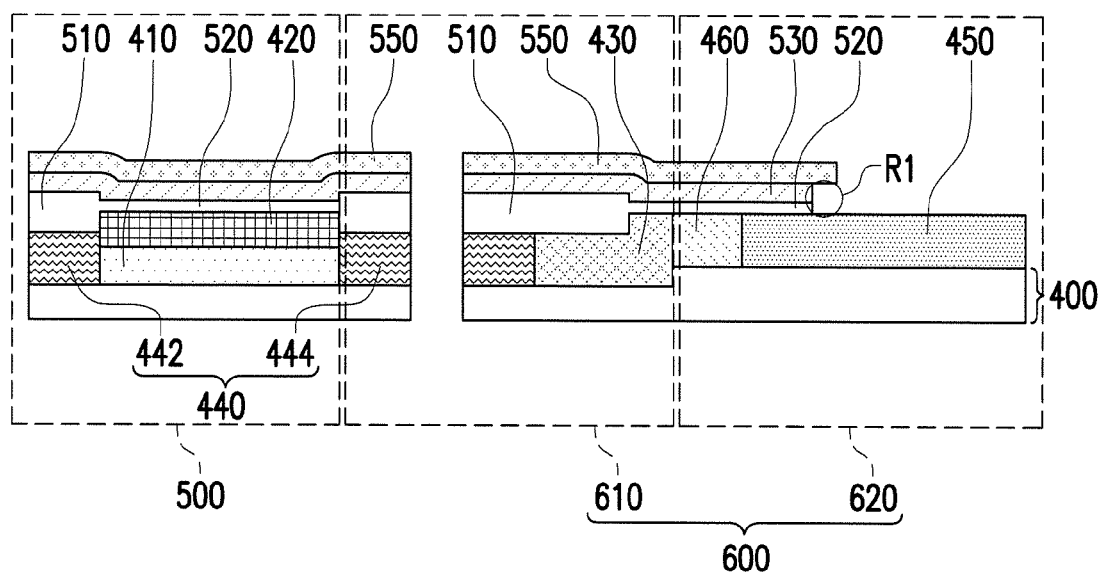

With reference to FIG. 1D and FIG. 3, in the step S104, a wet etching process is performed to remove one portion of the tunnel dielectric layer 520 in the low-voltage device region 620. In an embodiment of the invention, the etchant applied in the wet etching process may include, for instance, hydrofluoric acid, hydrofluoric acid vapor, a mixed solution containing nitric acid and hydrofluoric acid, thermal phosphoric acid (150° C.-200° C.), or a mixed solution containing sulfuric acid and hydrofluoric acid. To be specific, in said wet etching process, a portion of the first conductive layer 530 and a portion of the tunnel dielectric layer 520 below the first conductive layer 530 may be etched, such that a recess R1 is formed on a side surface of the remaining first conductive layer 530 and a side surface of the remaining tunnel dielectric layer 520.

Figure 1E:
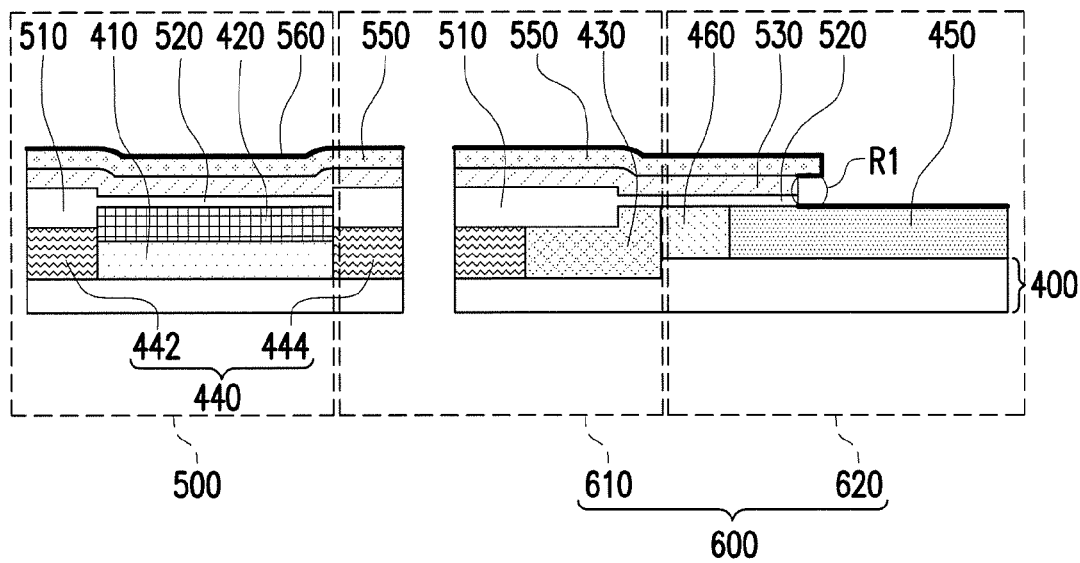

As shown in FIG. 1E and FIG. 3, the step S104 is performed to form a low-voltage gate dielectric layer 560 (e.g., a third gate dielectric layer) on the substrate 400. The low-voltage gate dielectric layer 560 covers the surface of the first dielectric layer 550 and a portion of a top surface of the substrate 400 in the low-voltage device region 620. That is, the low-voltage gate dielectric layer 560 does not cover the side surface of the remaining first conductive layer 530 and the side surface of the remaining tunnel dielectric layer 520. In an embodiment of the invention, the low-voltage gate dielectric layer 560 may be a silicon oxide layer, a silicon oxynitride layer, or a silicon nitride layer, for instance, and a method for forming the low-voltage gate dielectric layer 560 may include a chemical vapor deposition method, an in-situ vapor growth method, a low-pressure radical oxidation method, or a furnace oxidation method. According to an embodiment of the invention, a thickness of the low-voltage gate dielectric layer 560 is between 2 nm to 9 nm.

Figure 1F:
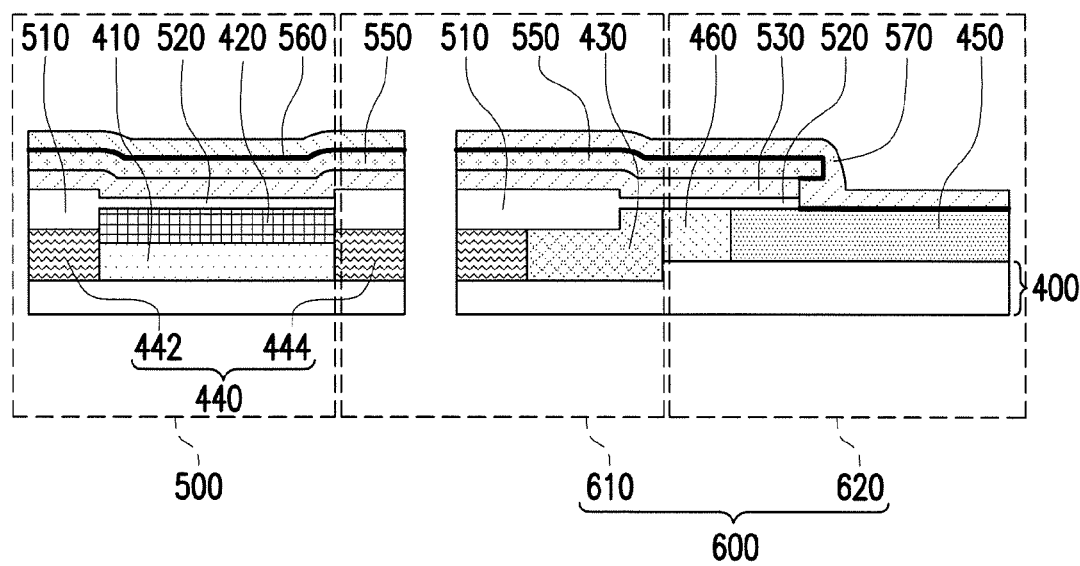

With reference to FIG. 1E, FIG. 1F, and FIG. 3, in the step S104, a second conductive layer 570 is formed on the substrate 400. In particular, the second conductive layer 570 covers a surface of the low-voltage gate dielectric layer 560, the side surface of the remaining first conductive layer 530, and the side surface of the remaining tunnel dielectric layer 520. Namely, the second conductive layer 570 is conformally formed on the surface of the low-voltage gate dielectric layer 560 and fills the recess R1. According to an embodiment of the invention, the second conductive layer 570 may include doped polysilicon, undoped polysilicon, or a combination thereof, for instance, and a method for forming the second conductive layer 570 may be a chemical vapor deposition method, a low-pressure chemical vapor deposition method, or a furnace oxidation method. In an embodiment of the invention, a thickness of the second conductive layer 570 is between 10 nm to 40 nm.

Figure 1G:
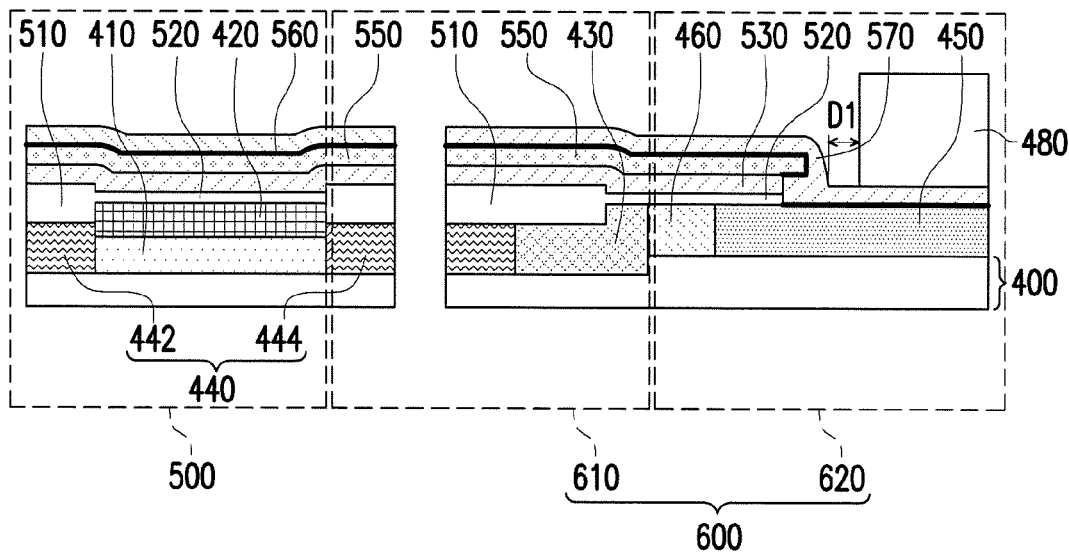

With reference to FIG. 1G, a patterned mask layer 480 is formed on the substrate 400. The patterned mask layer 480 may include, for instance, carbon or a photoresist material. According to an embodiment of the invention, the patterned mask layer 480 and the adjacent second conductive layer 570 are spaced by a distance D1. The distance D1 may be between 100 nm to 300 nm, for instance.

Figure 1H:
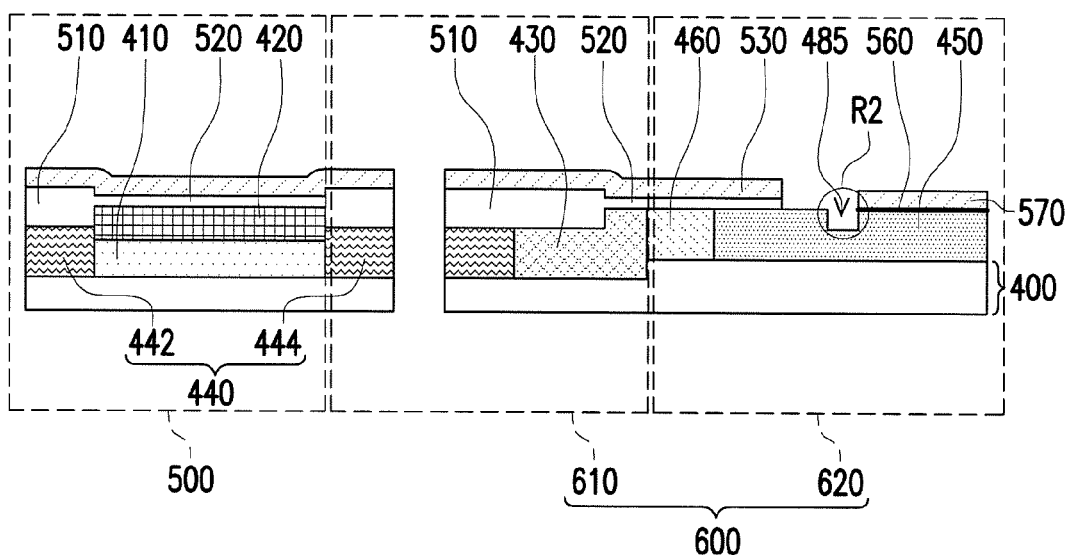

With reference to FIG. 1C, FIG. 1H, and FIG. 3, in a step S105, an etching process is performed to sequentially remove the second conductive layer 570, the low-voltage gate dielectric layer 560, and the first dielectric layer 550 in the cell region 500 and the high-voltage device region 610, so as to expose the surface of the first conductive layer 530. During the etching process, in order to completely remove the second conductive layer 570 conformally formed on the surface of the low-voltage gate dielectric layer 560, a portion of the first low-pressure well 450 (i.e., the substrate 400) not covered by the patterned mask layer 480 is removed because of the etching loss. Thus, a groove R2 is formed in a portion of the first low-pressure well 450. At this time, a sidewall of the first conductive layer 530, a sidewall of the tunnel dielectric layer 520, a top surface of the first low-voltage well 450, and the groove R2 may together constitute a step-shaped opening 485. The patterned mask layer 480 is then removed. In an embodiment of the invention, a method of removing the patterned mask layer 480 may include ashing the patterned mask layer 480 with use of high-density plasma and then performing a wet cleansing process.

Figure 1I:
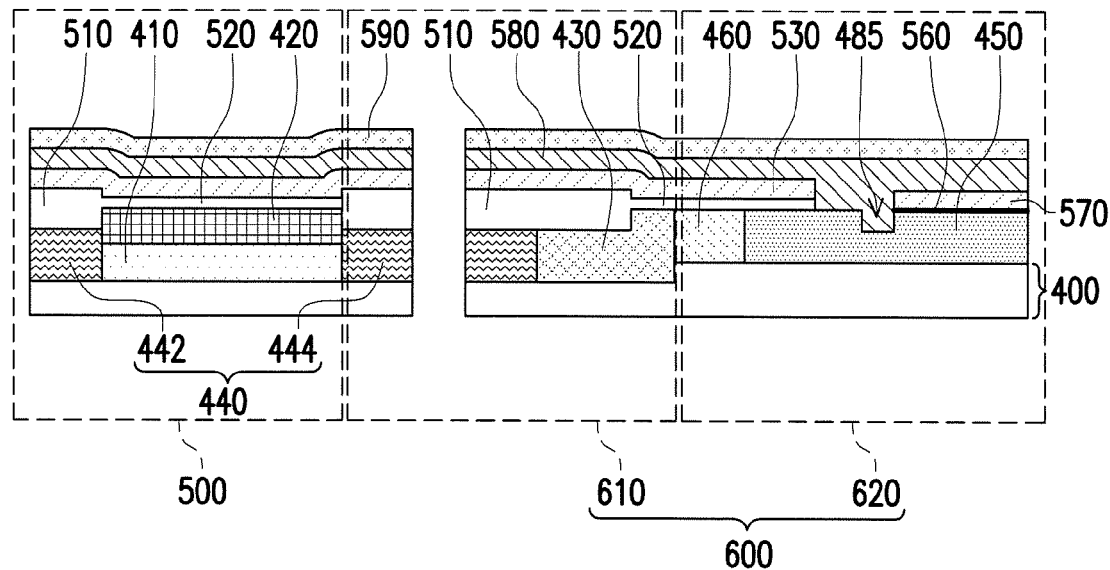

With reference to FIG. 1I and FIG. 3, a step S106 is performed to sequentially form a third conductive layer 580 and a second dielectric layer 590 on the substrate 400, so as to completely fill the step-shaped opening 485. The third conductive layer 580 may include doped polysilicon, undoped polysilicon, or a combination thereof, for instance, and a method for forming the third conductive layer 580 may be a chemical vapor deposition method, a low-pressure chemical vapor deposition method, or a furnace oxidation method. In an embodiment of the invention, a thickness of the third conductive layer 580 is between 50 nm to 150 nm. The second dielectric layer 590 may be a silicon oxide layer, a silicon oxynitride layer, or a silicon nitride layer, for instance, and a method for forming the second dielectric layer 590 may include a chemical vapor deposition method, a physical vapor deposition method, a thermal oxidation method, or a furnace oxidation method. In an embodiment of the invention, a thickness of the second dielectric layer 590 is between 10 nm to 100 nm.

Figure 1J:
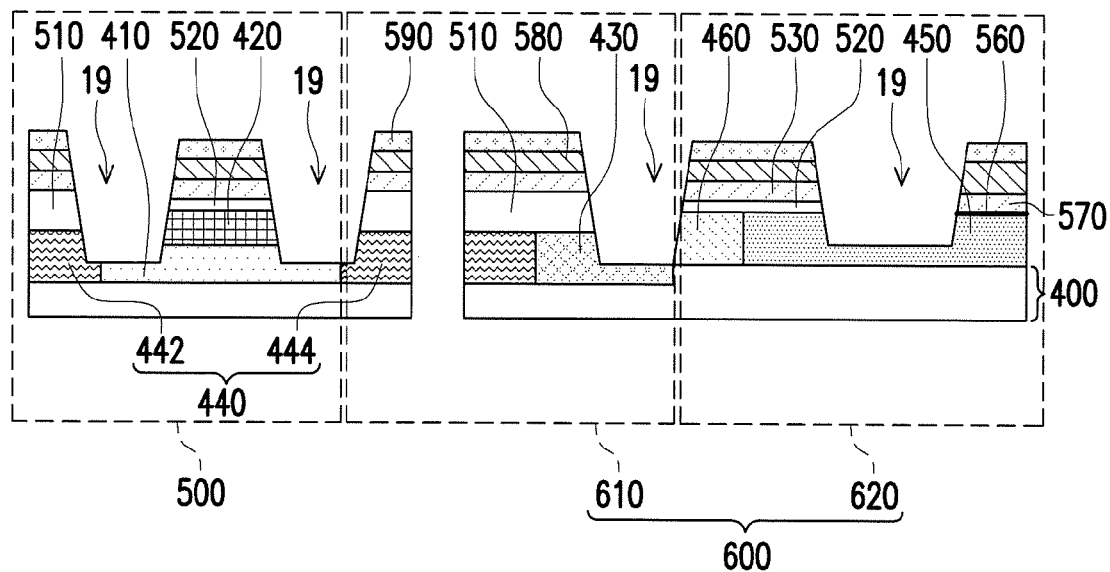

With reference to FIG. 1I, FIG. 1J, and FIG. 3, a step S107 is performed to form a plurality of trenches 19 in the substrate 400, and the trenches 19 penetrate the second dielectric layer 590 and extend to the substrate 400. Particularly, the trenches 19 are formed in the substrate 400 around the cell region 500, the high-voltage device region 610, and the low-voltage device region 620. The trenches between the cell region 500 and the high-voltage device region 610 are taken for example. In an embodiment of the invention, a patterned mask layer (not shown) is formed on the substrate 400, and a dry etching method (e.g., a reactive ion etching method) is performed to remove a portion of the substrate 400 as well as a portion of the second dielectric layer 590, a portion of the third conductive layer 580, a portion of the first conductive layer 530, a portion of the high-voltage gate dielectric layer 510, a portion of the tunnel dielectric layer 520, and a portion of the low-voltage gate dielectric layer 560 that are on the substrate 400, so as to form the trenches 19.

Figure 1K:
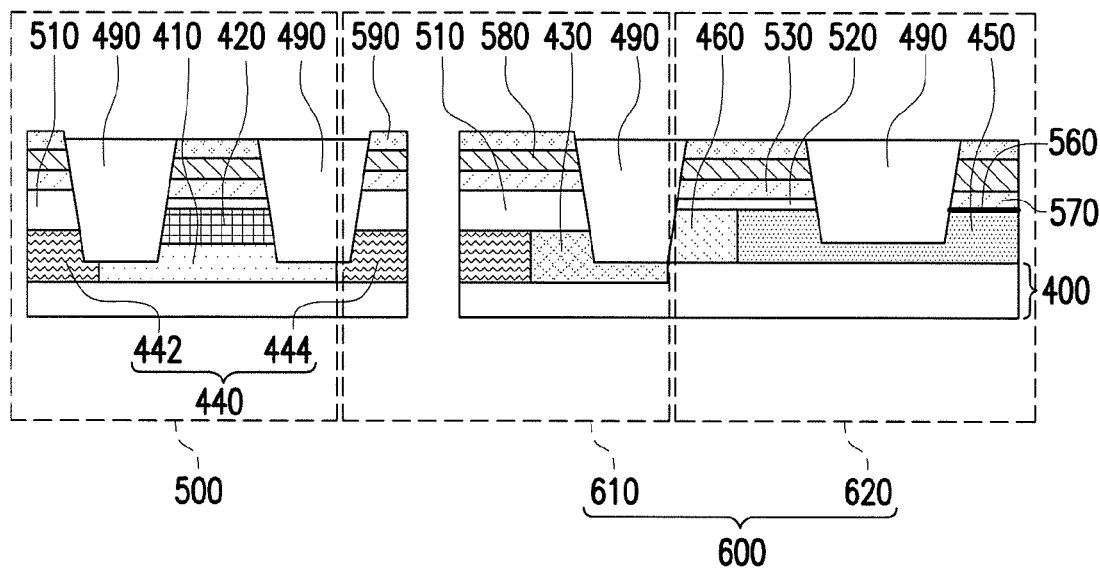

As shown in FIG. 1J, FIG. 1K, and FIG. 3, in the step S107, isolation structures 490 are formed in the trenches 19. Specifically, an isolation material layer (e.g., a high-density plasma oxide layer or spin-on glass) is formed on the substrate 400 to fill the trenches 19. The isolation material layer on the substrate 400 is planarized by chemical mechanical polishing to expose the second dielectric layer 590 on the substrate 400. A memory array is then formed on the cell region 400. Top surfaces of the isolation structures 490 and the top surface of the second dielectric layer 590 shown in FIG. 1K are not co-planar, which should however not be construed as a limitation to the invention. In another embodiment of the invention, the top surfaces of the isolation structures 490 may be co-planar with the top surface of the second dielectric layer 590, for instance.

With reference to FIG. 2A, FIG. 4, FIG. 1A, and FIG. 3, the manufacturing processes of the memory device provided in the second embodiment are similar to those provided in the first embodiment, i.e., the step S101 is similar to the step S201, the step S102 is similar to the step S202, and the step S103 is similar to the step S203. Since these similar steps have been described in the previous paragraphs, no other explanations are provided hereinafter. The difference between these two embodiments is explained below. In the first embodiment, the tunnel dielectric layer 520 is formed on the substrate 400 in the low-voltage device region 620 (i.e., the second region) and the cell region 500 (i.e., the third region), as shown in step S102; in the second embodiment, the low-voltage gate dielectric layer 560 is formed on the substrate 400 in the low-voltage device region 620 (i.e., the second region) and the cell region 500 (i.e., the third region), as shown in step S202.

Figure 2A:
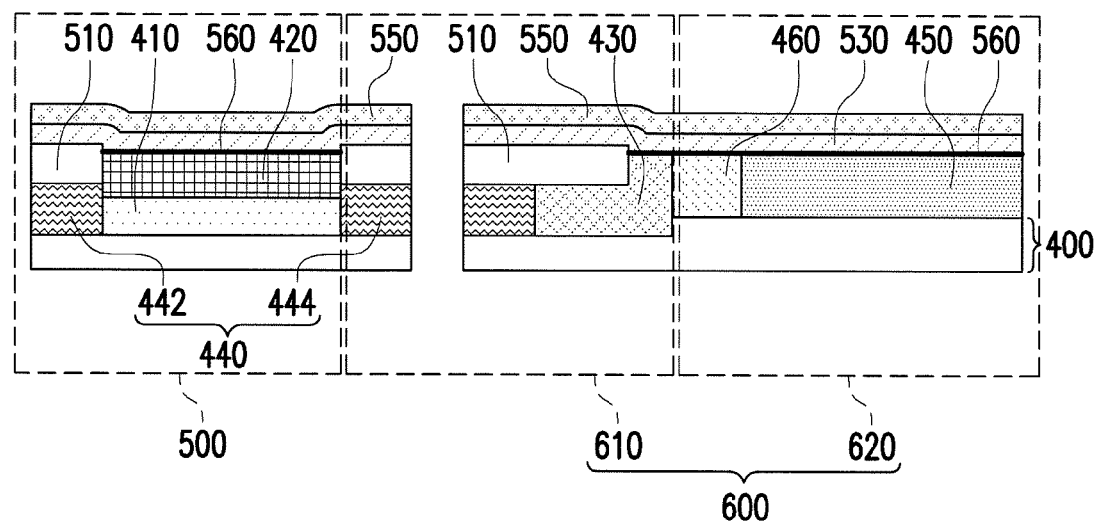
FIG. 2A to FIG. 2K are schematic cross-sectional views illustrating a method for fabricating a memory device according to a second embodiment of the invention.
Figure 2B:
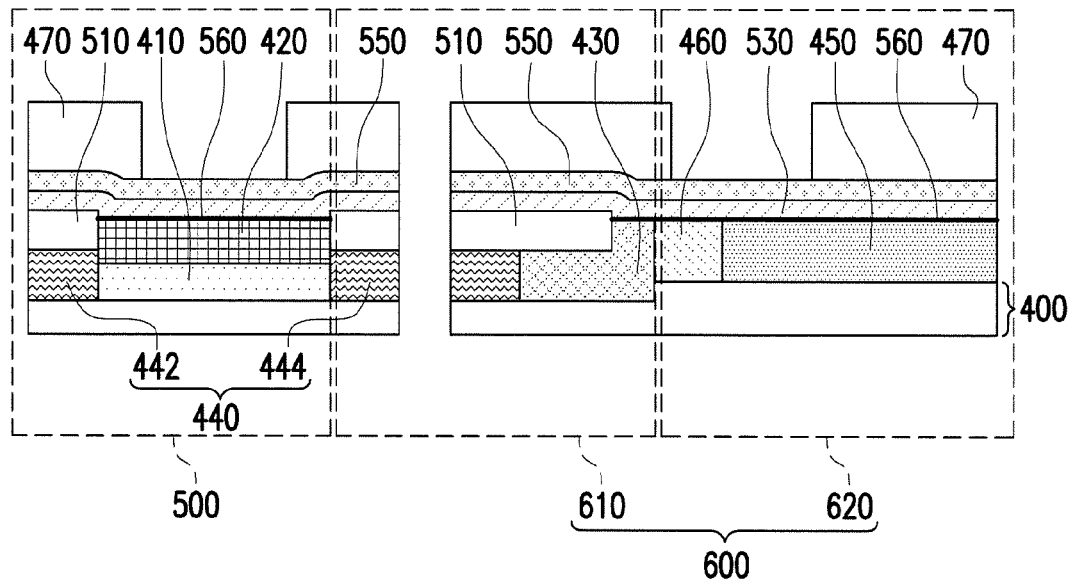

With reference to FIG. 2B, a patterned mask layer 470 is formed on the substrate 400. The patterned mask layer 470 may include, for instance, carbon or a photoresist material. The patterned mask layer 470 partially exposes a surface of the first dielectric layer 550 in the cell region 500 and the low-voltage device region 620.

Figure 2C:
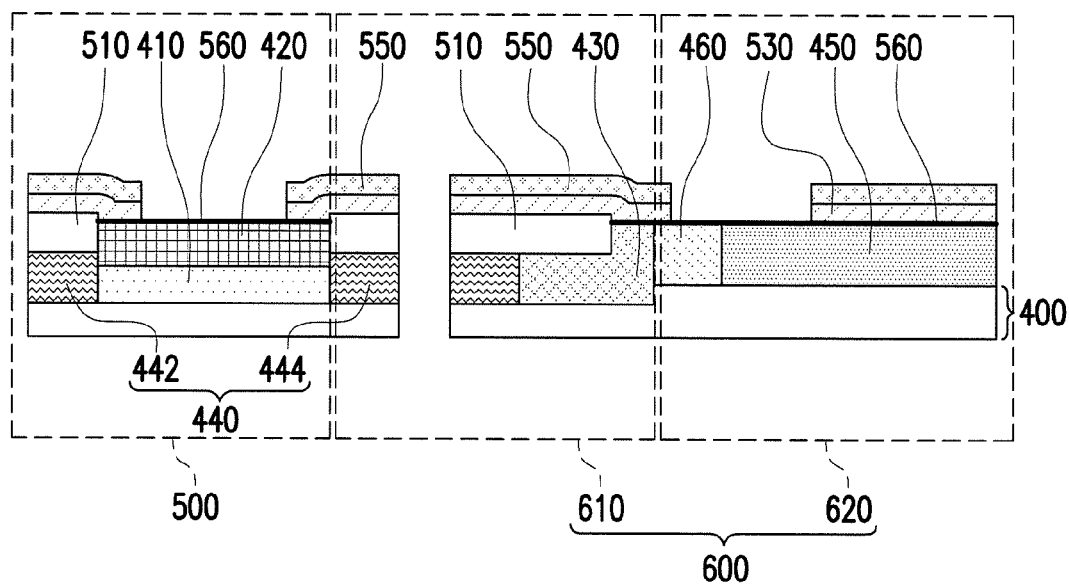
Figure 4:
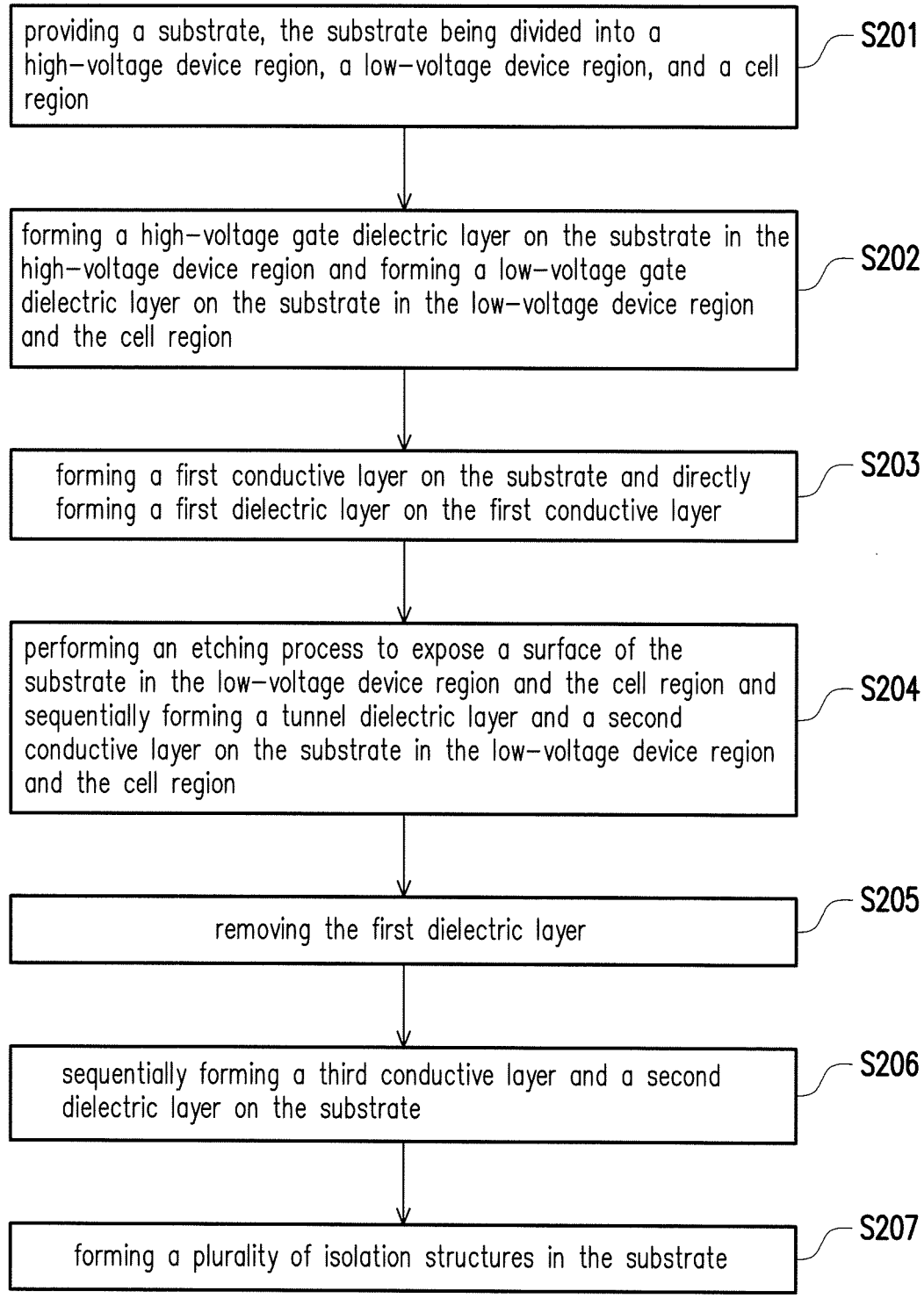
FIG. 4 is a flowchart illustrating the method for fabricating the memory device according to the second embodiment of the invention.

With reference to FIG. 2C and FIG. 4, in the step S204, an etching process is performed to sequentially remove one portion of the first dielectric layer 550 and one portion of the first conductive layer 530 in the cell region 500 and the low-voltage device region 620, so as to expose the surface of the low-voltage gate dielectric layer 560 (i.e., the second gate dielectric layer). The patterned mask layer 470 is then removed.

Figure 2D:
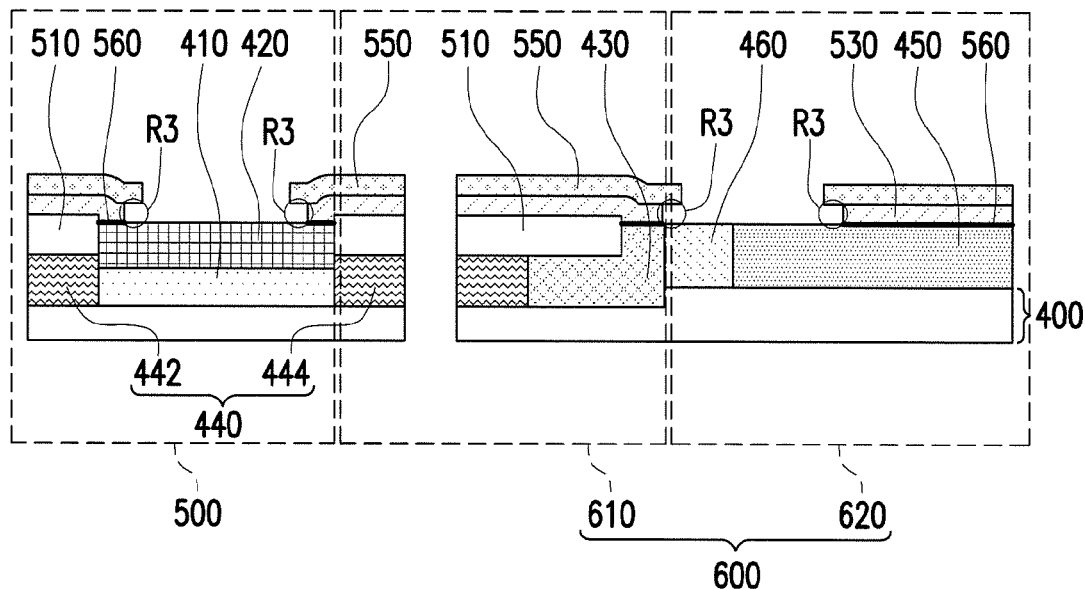

With reference to FIG. 2D and FIG. 4, in the step S204, a wet etching process is performed to remove the low-voltage gate dielectric layer 560 in the cell region 500 and the low-voltage device region 620. In said wet etching process, a portion of the first conductive layer 530 and a portion of the low-voltage gate dielectric layer 560 below the first conductive layer 530 may be etched, such that a recess R3 is formed on a side surface of the remaining first conductive layer 530 and a side surface of the remaining low-voltage gate dielectric layer 560.

Figure 2E:
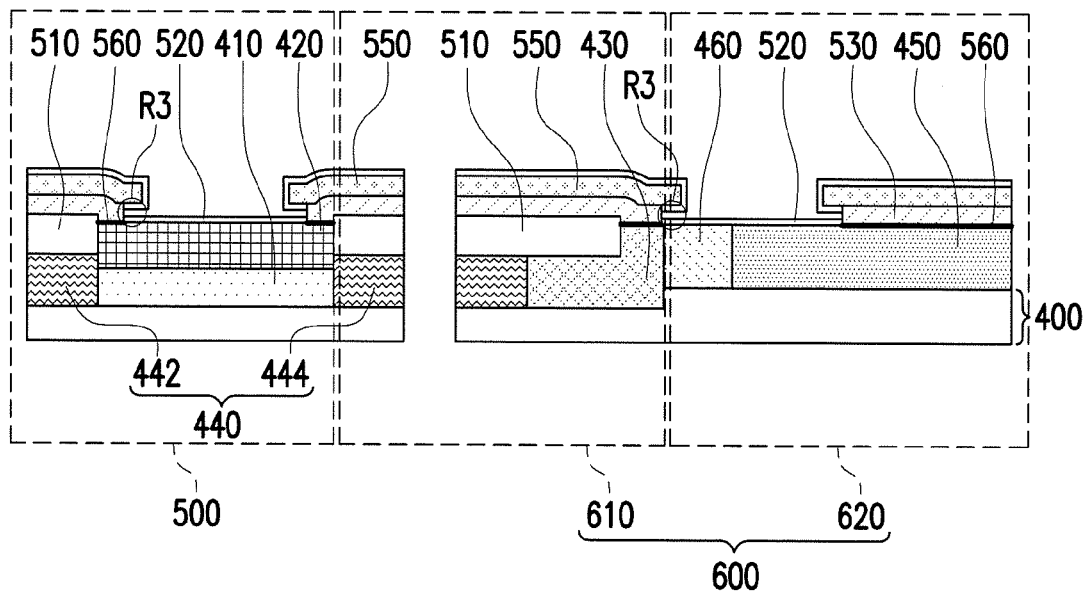

As shown in FIG. 2E and FIG. 4, the step S204 is performed to form the tunnel dielectric layer 520 (i.e., the third gate dielectric layer) on the substrate 400. The tunnel dielectric layer 520 covers the surface of the first dielectric layer 550 and a portion of a top surface of the substrate 400. That is, the tunnel dielectric layer 520 does not cover the side surface of the remaining first conductive layer 530.

Figure 2F:
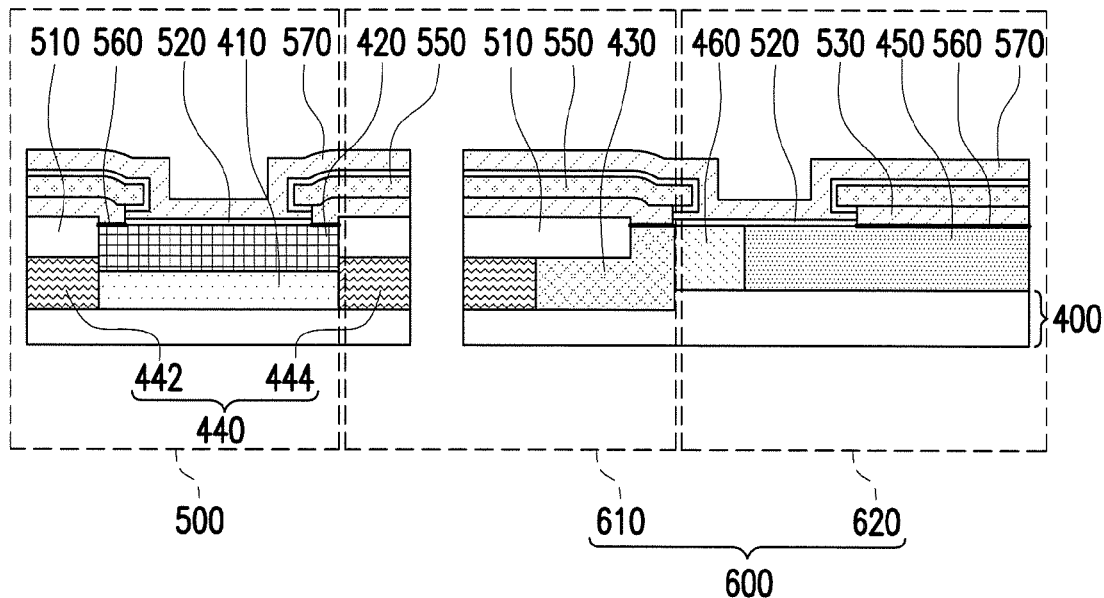

With reference to FIG. 2E, FIG. 2F, and FIG. 4, in the step S204, the second conductive layer 570 is formed on the substrate 400. In particular, the second conductive layer 570 covers the surface of the tunnel dielectric layer 520 and the side surface of the remaining first conductive layer 530. Namely, the second conductive layer 570 is conformally formed on the surface of the tunnel dielectric layer 520 and fills the recess R3.

Figure 2G:
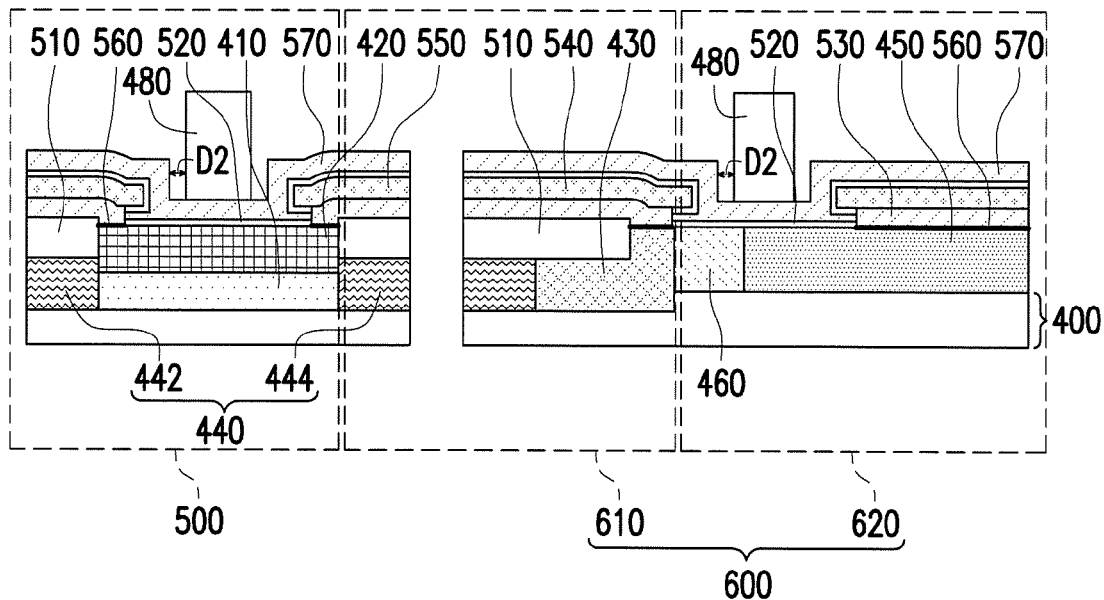
Figure 2H:
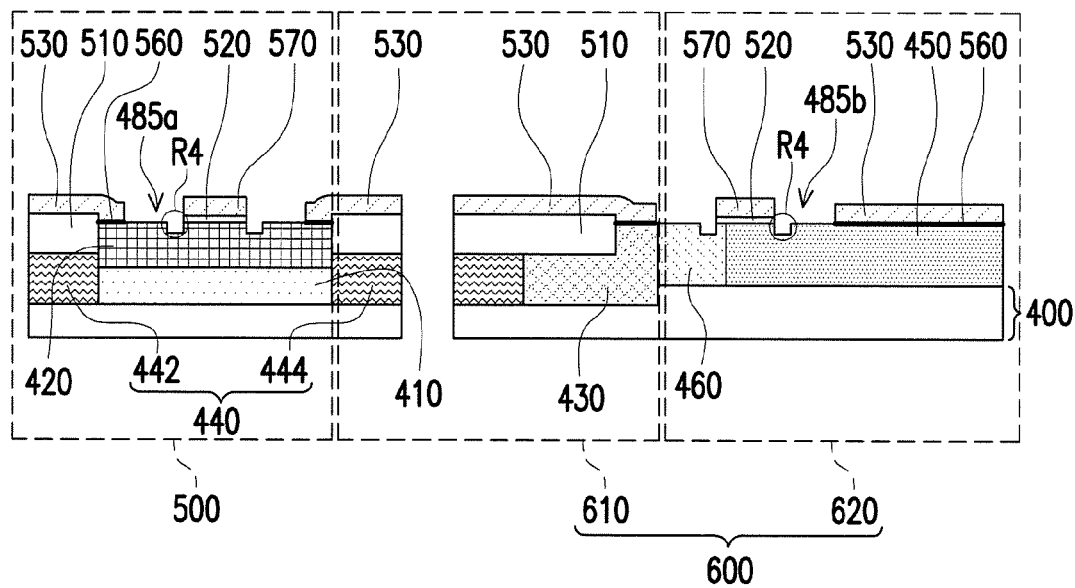

With reference to FIG. 2G, a patterned mask layer 480 is formed on the substrate 400. Particularly, the patterned mask layer 480 partially covers the surface of the second conductive layer 570 in the cell region 500 and the low-voltage device region 620. According to an embodiment of the invention, the patterned mask layer 480 and the adjacent second conductive layer 570 are spaced by a distance D2. The distance D2 may be between 100 nm to 300 nm, for instance With reference to FIG. 2G, FIG. 2H, and FIG. 4, in a step S205, an etching process is performed to sequentially remove the second conductive layer 570, the tunnel dielectric layer 520, and the first dielectric layer 550 that are not covered by the patterned mask layer 480, so as to expose the surface of the first conductive layer 530. During the etching process, in order to completely remove the second conductive layer 570 conformally formed on the sidewall of the first conductive layer 530, a portion of the first well 420, a portion of the first low-voltage well 450, and a portion of the second low-voltage well 460 (i.e., the substrate 400) that are not covered by the patterned mask layer 480 are removed because of the etching loss. Thus, one groove R4 is formed in the first well 420 and another groove R4 is formed in the first low-voltage well 450. At this time, one sidewall of the second conductive layer 570, one sidewall of the tunnel dielectric layer 520, a surface of the first well 420, and the one groove R4 may together constitute a step-shaped opening 485a; another sidewall of the second conductive layer 570, another sidewall of the tunnel dielectric layer 520, a surface of the first low-voltage well 450, and the another groove R4 may together constitute a step-shaped opening 485b. The patterned mask layer 480 is then removed.

Figure 2I:
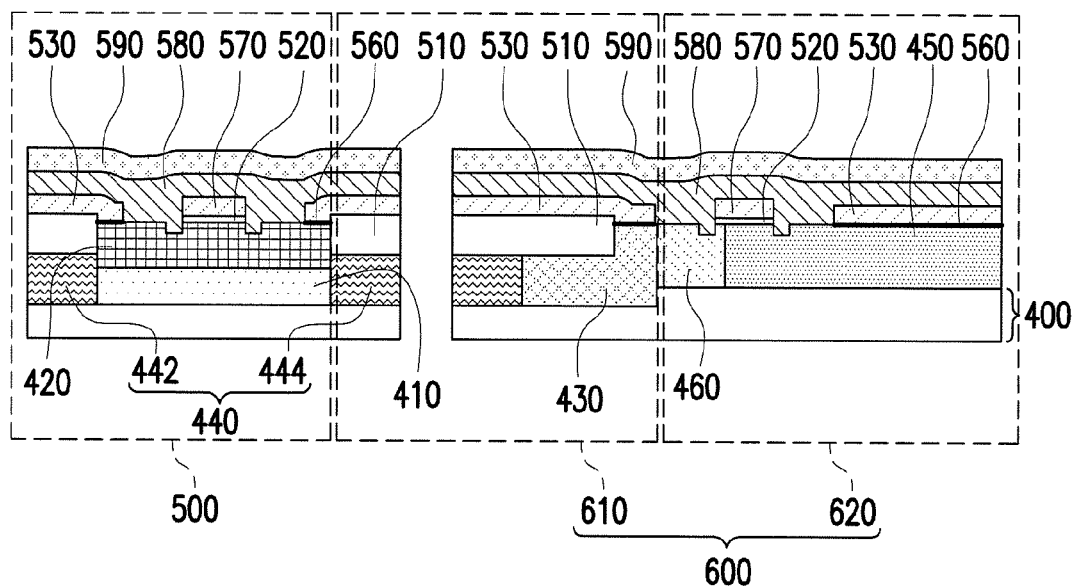

With reference to FIG. 2I and FIG. 4, a step S206 is performed to sequentially form the third conductive layer 580 and the second dielectric layer 590 on the substrate 400, so as to completely fill the step-shaped openings 485a and 485b.

Figure 2J:
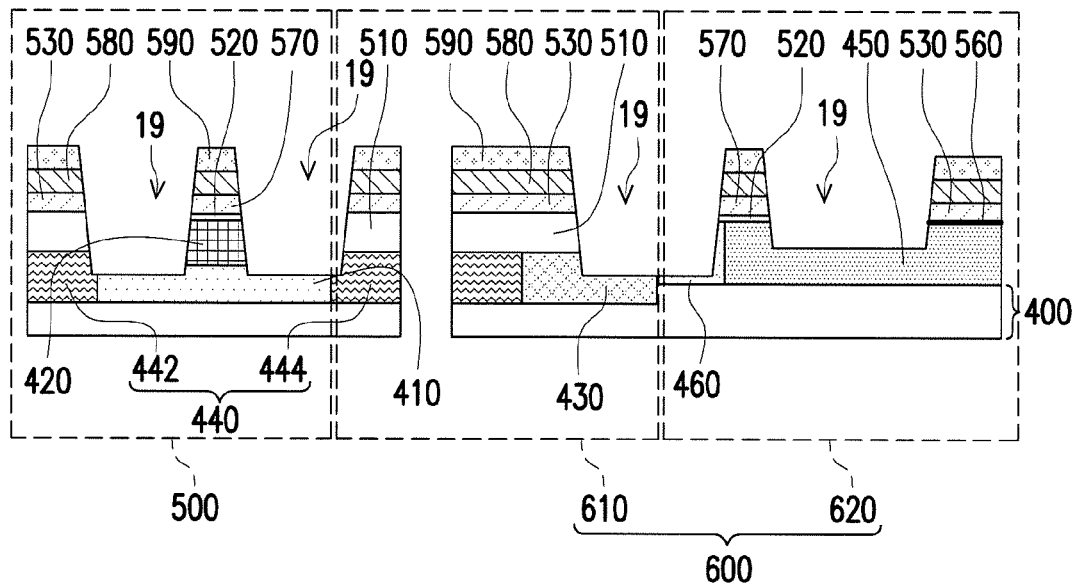

With reference to FIG. 2J and FIG. 4, a step S207 is performed to form a plurality of trenches 19 in the substrate 400, and the trenches 19 penetrate the second dielectric layer 590 and extend to the substrate 400. Particularly, the trenches 19 are formed in the substrate 400 around the cell region 500, the high-voltage device region 610, and the low-voltage device region 620.

Figure 2K:
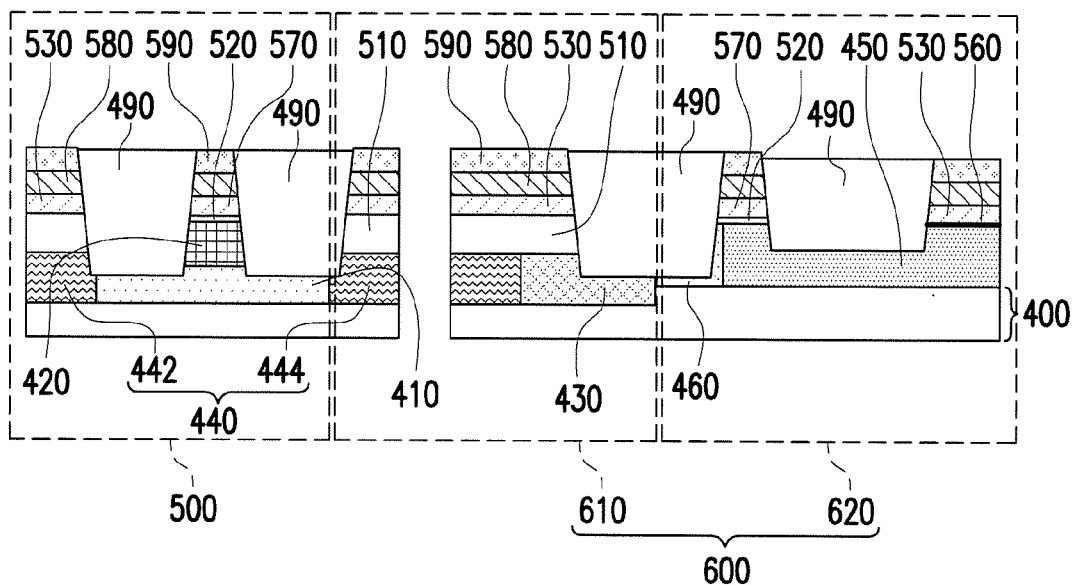

With reference to FIG. 2K and FIG. 4, in the step S207, isolation structures 490 are formed in the trenches 19. The isolation structures 490 are located in the substrate 400 around the cell region 500, the high-voltage device region 610, and the low-voltage device region 620 and may be configured to electrically insulate components in the cell region 500, the high-voltage device region 610, and the low-voltage device region 620. A memory array is then formed on the cell region 400.

Note that the method for forming the memory device as provided herein does not include the step of forming the buffer oxide layer. Hence, according to the present embodiment, the issue of the remaining buffer oxide layer between the first conductive layer 530 and the third conductive layer 580 (i.e., the floating gates) can be avoided. Meanwhile, the manufacturing processes can be simplified, and the production costs can be lowered down.

In addition, according to the method for fabricating the memory device as provided in the second embodiment, the high-voltage gate dielectric layer 510 is formed, and then the low-voltage gate dielectric layer 560 is formed (i.e., the step S202). After that, the tunnel dielectric layer 520 is formed in the step S204. The tunnel dielectric layer 520 is formed after the high-voltage gate dielectric layer 510 and the low-voltage gate dielectric layer 560 are formed, such that the quality of the surface of the tunnel dielectric layer 520 is not reduced by multiple photolithography and etching processes, and that the reliability of the products can be improved.

Besides, the order of performing the manufacturing steps in the method for fabricating the memory device as provided herein is not limited in the invention. For instance, in the method for fabricating the memory device as provided herein, the high-voltage gate dielectric layer 510 may be formed before the low-voltage gate dielectric layer 560 is formed, and the tunnel dielectric layer 520 is then formed; alternatively, the high-voltage gate dielectric layer 510 may be formed first, the tunnel dielectric layer 520 may be formed thereafter, and then the low-voltage gate dielectric layer 560 is formed.

To sum up, in the method for fabricating the memory device as provided herein, the triple gate oxide manufacturing process is performed to integrate the components in the cell region and the periphery region on the same chip. The triple gate oxide manufacturing process does not include the step of forming the buffer oxide layer, so as to avoid the issue of the remaining buffer oxide layer between the floating gates. Through applying the method for fabricating the memory device as provided herein, the resistance of the floating gates and the contacts can be reduced, and the performance, the reliability, and the yield of the resultant products can be improved. Besides, compared to the conventional method, the method for manufacturing the memory device provided herein does not include the step of forming the buffer oxide layer; hence, the manufacturing process can be simplified, and the production costs can be reduced.

What is claimed is:

1. A method for fabricating a memory device, the method comprising:
    providing a substrate, the substrate being divided into a first region, a second region, and a third region;
    forming a first gate dielectric layer on the substrate in the first region;
    forming a second gate dielectric layer on the substrate in the second region and the third region;
    forming a first conductive layer on the substrate;
    directly forming a first dielectric layer on the first conductive layer, wherein the first dielectric layer comprises silicon nitride, and no oxide layer is located between the first dielectric layer and the first conductive layer;
    removing one portion of the first dielectric layer, one portion of the first conductive layer, and one portion of the second gate dielectric layer in the second region to partially expose a surface of the substrate in the second region, comprising:
        etching a portion of the first conductive layer and a portion of the second gate dielectric layer to form a recess on a side surface of a remaining first conductive layer and a side surface of a remaining second gate dielectric layer, wherein the first dielectric layer protrudes from the side surface of the remaining first conductive layer and the side surface of the remaining second gate dielectric layer;
    sequentially forming a third gate dielectric layer and a second conductive layer on the substrate in the second region;
    sequentially forming a third conductive layer and a second dielectric layer on the substrate; and
    forming a plurality of isolation structures in the substrate, wherein the isolation structures penetrate the second dielectric layer and extend into the substrate.

2. The method according to claim 1, wherein the first conductive layer is in direct contact with the first dielectric layer.

3. The method according to claim 1, wherein in the step of forming the third gate dielectric layer and the second conductive layer, a groove is simultaneously formed in the substrate in the second region, and a method of forming one of the isolation structures comprises a step of removing the substrate and the first conductive layer around the groove as well as the second dielectric layer and the third conductive layer above the groove to form a trench and a step of filling the trench with an isolation material layer.

4. The method according to claim 1, wherein the second gate dielectric layer in the third region is a tunnel dielectric layer.

5. The method according to claim 1, wherein the step of removing the one portion of the first dielectric layer, the one portion of the first conductive layer, and the one portion of the second gate dielectric layer in the second region further comprises:
    removing one portion of the first dielectric layer, one portion of the first conductive layer, and one portion of the second gate dielectric layer in the third region, so as to partially expose a surface of the substrate in the third region.

6. The method according to claim 5, wherein the step of sequentially forming the third gate dielectric layer and the second conductive layer on the substrate in the second region further comprises:
    sequentially forming the third gate dielectric layer and the second conductive layer on the substrate in the third region, wherein the third gate dielectric layer in the third region is a tunnel dielectric layer.

7. The method according to claim 6, wherein in the step of forming the third gate dielectric layer and the second conductive layer on the substrate in the second region and the third region, one groove is simultaneously formed in the substrate in the second region, and another groove is simultaneously formed in the substrate in the third region, wherein a method of forming one of the isolation structures comprises a step of removing the substrate and the first conductive layer around the grooves as well as the second dielectric layer and the third conductive layer above the grooves to form two trenches and a step of filling the trenches with an isolation material layer.

8. The method according to claim 1, before forming the first gate dielectric layer, further comprising:
    forming a deep well of a first conductive type in the substrate in the third region;
    forming a first well of a second conductive type on the deep well; and
    forming two high-voltage wells of the first conductive type respectively at two sides of the deep well.

9. The method according to claim 1, wherein a thickness of the first gate dielectric layer, a thickness of the second gate dielectric layer, and a thickness of the third gate dielectric layer are different from one another.

10. The method according to claim 1, wherein a thickness of the first dielectric layer is between 10 nm to 40 nm.

* * * * *